(12) United States Patent
Takayoshi et al.

(10) Patent No.: US 7,281,327 B2
(45) Date of Patent: Oct. 16, 2007

(54) METHOD FOR MANUFACTURING DOUBLE-SIDED PRINTED CIRCUIT BOARD

(75) Inventors: Yuichi Takayoshi, Ibaraki (JP); Mineyoshi Hasegawa, Ibaraki (JP); Yasushi Tsuda, Ibaraki (JP); Akinori Itokawa, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 204 days.

(21) Appl. No.: 11/122,369

(22) Filed: May 5, 2005

(65) Prior Publication Data
US 2006/0016072 A1    Jan. 26, 2006

(30) Foreign Application Priority Data
May 7, 2004    (JP) ............................. 2004-138098

(51) Int. Cl.
*H01K 3/10*    (2006.01)
(52) U.S. Cl. ............................ 29/852; 29/846; 427/97.2
(58) Field of Classification Search .................. 29/846, 29/852; 427/97.2
See application file for complete search history.

(56) References Cited

U.S. PATENT DOCUMENTS

| | | | | |
|---|---|---|---|---|
| 4,211,603 A | * | 7/1980 | Reed ............................ | 216/18 |
| 4,720,324 A | * | 1/1988 | Hayward ....................... | 216/18 |
| 5,231,751 A | * | 8/1993 | Sachdev et al. ............... | 29/852 |
| 5,421,083 A | * | 6/1995 | Suppelsa et al. ............... | 29/852 |
| 6,228,511 B1 | * | 5/2001 | Sachdev et al. ............. | 428/626 |
| 2003/0221314 A1 | | 12/2003 | Naito et al. | |
| 2006/0016072 A1 | * | 1/2006 | Takayoshi et al. ............. | 29/852 |

FOREIGN PATENT DOCUMENTS

| | | |
|---|---|---|
| JP | 54-120865 A | 9/1979 |
| JP | 64-1291 A | 1/1989 |
| JP | 11-87886 A | 3/1999 |
| JP | 2000-151068 A | 5/2000 |
| JP | 2000-294924 A | 10/2000 |
| JP | 2003-008204 A | 1/2003 |
| JP | 2003-234572 A | 8/2003 |

* cited by examiner

*Primary Examiner*—Carl J. Arbes
(74) *Attorney, Agent, or Firm*—Akin Gump Strauss Hauer & Feld LLP

(57) ABSTRACT

An insulating substrate with metal foils on both sides thereof is prepared, and a through hole that passes through the metal foils and insulating substrate is formed. An electroless copper plating layer is formed on an inner surface of the through hole and a surface of each of the metal foils, followed by the formation of an electrolytic copper plating layer on the overall surface of the electroless copper plating layer. After removing the electrolytic copper plating layer except the portions on the inner surface and a peripheral region of the through hole, the metal foils are processed to form conductor patterns.

13 Claims, 2 Drawing Sheets

METHOD FOR MANUFACTURING DOUBLE-SIDED PRINTED CIRCUIT BOARD

BACKGROUND OF THE INVENTION

1. Field of the Invention

The present invention relates to a method for manufacturing double-sided printed circuit boards including an insulating substrate having conductor patterns formed on both sides thereof.

2. Description of the Background Art

Printed circuit boards are used in a variety of electrical or electronic devices. Among the printed circuit boards are single-sided printed circuit boards including an insulating substrate of e.g. an insulating plastic having a conductor pattern made of a metal foil such as copper on one side thereof and double-sided printed boards including an insulating substrate having conductor patterns on both sides thereof.

In a double-sided printed circuit board, a via hole that is metal plated or the like is used to establish an electrical connection between the conductor patterns on the sides of an insulating substrate. Among via holes are through holes that are formed to pass through the conductor patterns on both sides and an insulating substrate, and blind via holes that are formed to pass through the conductor pattern on one side only and an insulating substrate.

JP 2003-8204 A discloses a method for manufacturing printed circuit boards that provide formation of fine patterns as well as improved flexural properties and dimensional accuracy, while preventing electrical connection between terminals. The method as disclosed in JP 2003-8204 is now described.

An insulating substrate with metal foils on both sides thereof is first prepared. Next, a through hole is formed so that it passes through the insulating substrate and metal foils on both sides, followed by the formation of an electroless copper plating layer on the surfaces of the metal foils.

Then, the metal foils are patterned by etching to form conductor patterns that include a peripheral region of the through hole. A plating resist is subsequently formed over the electroless copper plating layer except the portions on the inner surface and the peripheral region of the through hole, and then with the plating resist as a mask, an electrolytic copper plating layer is formed on the electroless copper plating layer on the inner surface and peripheral region of the through hole. After this, the electroless copper plating layer is removed except the portions under the electrolytic copper plating layer. Finally, the above is coated with a cover layer.

The double-sided printed circuit board thus formed according to the method described in JP 2003-8204 A exhibits high flexural properties, since the electrolytic copper plating layer is formed only on the inner surface and peripheral region of the through hole and not on the other regions.

The double-sided printed circuit board according to JP 2003-8204 A, however, shows a tendency for uneven thickness of the electrolytic metal plating layer on the peripheral region of the through hole.

This may result in deterioration of the reliability of electrical connection in connecting the double-sided printed circuit board with electronic parts such as semiconductor devices or other wiring circuit boards.

SUMMARY OF THE INVENTION

An object of the present invention is to provide a method for manufacturing double-printed circuit boards with improved flexural properties and electrical connection reliability.

The present inventors have carried out various experiments and considerations to find out that the above-mentioned problematic tendency of the thickness of the electrolytic metal plating layer on the peripheral region of the via hole to become uneven is due to increases in the current density in the peripheral region of the via hole during the formation of the electrolytic metal plating layer. Thus, in order to make the current density uniform during the formation of the electrolytic metal plating layer, the inventors have devised the invention as shown below.

According to one aspect of the invention, a method for manufacturing a double-sided printed circuit board comprises the steps of preparing an insulating substrate having conductor layers on both sides thereof, forming a via hole that passes through at least one of the conductor layers and the insulating substrate, forming a conductive layer on an inner surface of the via hole and surfaces of the conductor layers, forming an electrolytic metal plating layer on an overall surface of the conductive layer, removing the electrolytic metal plating layer except portions on the inner surface of the via hole and a peripheral region of the via hole, and after removing the electrolytic metal plating layer, processing the conductor layers to form conductor patterns.

In the method for manufacturing the double-sided printed circuit board, the insulating substrate having the conductor layers on its both sides is prepared, and the via hole that passes through at least one of the conductor layers and the insulating substrate is formed. The conductive layer is then formed on the inner surface of the via hole and the surfaces of the conductor layers, followed by the formation of the electrolytic metal plating layer on the overall surface of the conductive layer. Then, the electrolytic metal plating layer is removed except the portions on the inner surface and peripheral region of the via hole, after which the conductor layers are processed to form the conductor patterns.

In this manner, the electrolytic metal plating layer is formed on the overall surface of the conductive layer, which makes the current density including that of the peripheral region of the via hole uniform. This allows for a uniform thickness of the electrolytic metal plating layer on the peripheral region of the via hole. Further, the electrolytic metal plating layer is removed, after its formation, except the portions on the inner surface and peripheral region of the via hole, thus leading to improved flexural properties. This results in a double-sided printed circuit board with improved flexural properties and electrical connection reliability.

The step of forming the via hole may include the step of forming a through hole that passes through both of the conductor layers and the insulating substrate as the via hole.

The step of forming the via hole may include the step of forming a hole that passes through one of the conductor layers and the insulating substrate.

The method of manufacture may further comprise the step of, after removing the electrolytic metal plating layer, reducing the thickness of each of the conductor layers except that of the peripheral region of the via hole.

In this manner, the thickness of each of the conductor layers except the thickness of the peripheral region of the via hole is reduced, allowing for further improved flexural properties of the double-sided printed circuit board.

The step of preparing the insulating substrate may include the step of preparing a flexible substrate having conductor layers on both sides thereof as the insulating substrate. The flexural properties of the flexible substrate allow for even further improved flexural properties of the double-sided printed circuit board.

The step of preparing the insulating substrate may include the step of preparing an insulating substrate having metal films as the conductor layers on both sides thereof.

The step of forming the conductive layer may include the step of forming an electroless metal plating layer as the conductive layer.

The step of forming the conductive layer may include the step of forming a carbon layer as the conductive layer.

The step of preparing the insulating substrate having the conductor layers on the both sides thereof may include the steps of forming a first resin layer on a first metal layer, forming a second resin layer on a second metal layer, superimposing the second resin layer on the first resin layer to form a laminate including the first metal layer, the first resin layer, the second resin layer, and the second metal layer, and applying pressure and heat to the laminate.

This allows the manufacture of the insulating substrate having the conductor layers on its both sides without using an adhesive.

The method of manufacture may further comprise the step of forming a resin layer on the insulating substrate so as to cover the conductor patterns. The conductor patterns are thus protected with the resin layer.

According to the present invention, the manufacture of double-sided printed circuit boards with improved flexural properties and electrical connection reliability is possible.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Methods for manufacturing double-sided printed circuit boards according to embodiments of the present invention will be described below. First, a method for manufacturing a double-sided printed board according to a first embodiment will be described where a through hole that passes through both of the conductor layers and the insulating substrate is formed as a via hole, and then, a method for manufacturing a double-sided printed board according to a second embodiment will be described where a blind via hole that passes through one of the conductor layers and the insulating substrate is formed as a via hole.

First Embodiment

FIGS. 1(a), 1(b), 1(c), 1(d), 1(e), 1(f), 1(g), and 1(h) are cross-sectional views showing the manufacturing steps of a double-sided printed circuit board according to the first embodiment. The double-sided printed circuit board in the first embodiment is a flexible circuit board.

Figure 1A:
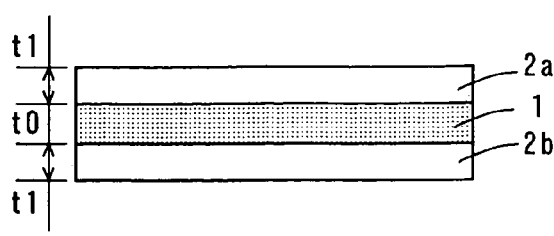
FIGS. 1(a), 1(b), 1(c), 1(d), 1(e), 1(f), 1(g), and 1(h) are cross sectional views showing the manufacturing steps of a double-sided printed circuit board according to a first embodiment of the present invention.

As shown in FIG. 1(a), an insulating substrate 1 having a metal foil 2a and a metal foil 2b, respectively, on its both sides is prepared first. The metal foils 2a and 2b are made of copper, and the insulating substrate 1 is made of a layer of polyimide resin. The insulating substrate 1 preferably has a thickness t0 of not smaller than 12.5 µm and not greater than 125 µm. Each of the metal foils 2a, 2b preferably has a thickness t1 of not smaller than 5 µm and not greater than 35 µm. A method for manufacturing the insulating substrate 1 with the metal foils 2a, 2b will be described below.

Figure 1B:
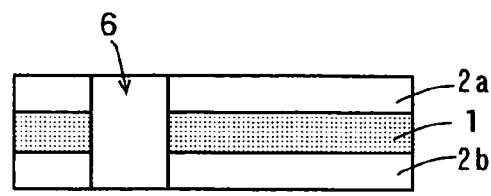

Next, as shown in FIG. 1(b), a through hole 6 is formed in a prescribed position such that it passes through the metal foils 2a, 2b and the insulating substrate 1. The through hole 6 is formed by drilling, punching, laser machining or other processes. The inside diameter of the through hole 6 is preferably not smaller than 25 µm and not greater than 500 µm.

Figure 1C:
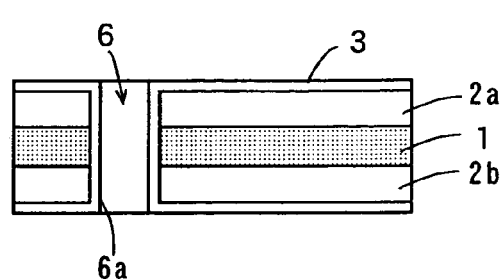

A conductive layer is subsequently formed over the insulating substrate 1 and metal foils 2a, 2b. In the first embodiment, an electroless copper plating layer 3 is used as the conductive layer. More specifically, the surfaces of the insulating substrate 1 and metal foils 2a, 2b are coated with a palladium catalyst, and then immersed in a copper plating solution. The electroless copper plating layer 3 is thus formed on an inner surface 6a of the through hole 6 and the surfaces of the metal foils 2a, 2b, as shown in FIG. 1(c). The metal foil 2a and metal foil 2b are electrically connected through the electroless copper plating layer 3. The electroless copper plating layer 3 has a thickness of 0.3 µm, for example.

Figure 1D:
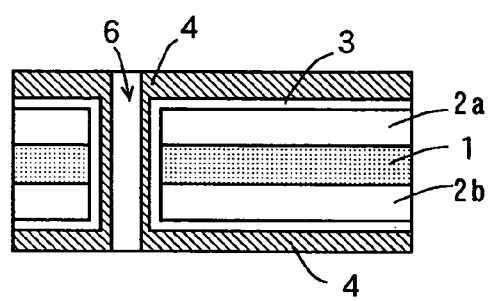

After this, electrolytic copper plating is applied to the overall surface of the electroless copper plating layer 3 to form an electrolytic copper plating layer 4, as shown in FIG. 1(d). The electrolytic copper plating layer 4 preferably has a thickness of not smaller than 5 µm and not greater than 20 µm, for example.

Figure 1E:
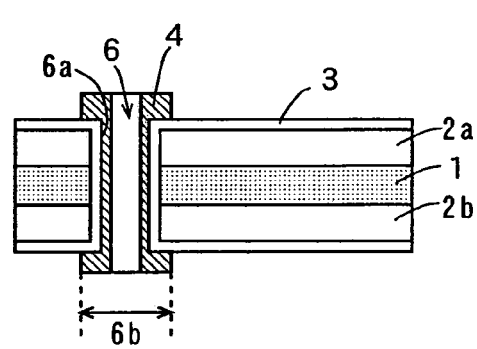
Figure 1F:
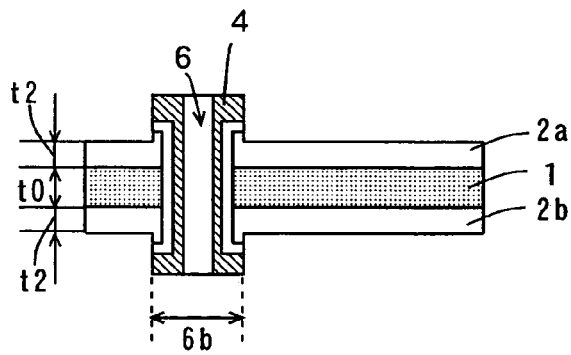

Etching is then performed with an etch resist (not shown) formed on the portions of the through hole 6 and a peripheral region 6b of the through hole to remove the electrolytic copper plating layer 4 except the portions of the through hole 6 and the peripheral region 6b, as shown in FIG. 1(e).

It is preferred that the peripheral region 6b is defined within the range of a radius of not smaller than 100 µm and not greater than 500 µm, for example, of the center of the through hole 6.

After removing the electrolytic copper plating layer 4 except the portions of the through hole 6 and peripheral region 6b, the electroless copper plating layer 3 and metal foils 2a, 2b are etched except the portion on the peripheral region 6b of the through hole 6 to reduce the thickness of each of the metal foils 2a, 2b. The above-described etching process is soft etching using sodium persulfate, for example. The thickness removed by the etching process may be controlled by the temperature and duration of etching or the concentration of an etching solution (sodium persulfate).

The thickness removed by etching is preferably not smaller than 1 µm and not greater than 10 µm. A thickness t2 of smaller than 5 µm of each of the etched metal foils 2a, 2b may result in increased possibility of disconnections in conductor patterns, whereas a thickness t2 of greater than 20

μm of each of the etched metal foils 2a, 2b may result in deteriorated flexural properties. For this reason, it is preferred that each of the metal foils 2a, 2b has a uniform thickness t2 of not smaller than 5 μm and not greater than 20 μm.

After this, each of the metal foils 2a, 2b having its thickness reduced by etching is cleaned with an acid, and subsequently, a photoresist (not shown) is formed on the surface of each of the metal foils 2a, 2b. The resulting metal foils 2a, 2b are patterned into a desired shape by exposure and development processes.

Figure 1G:
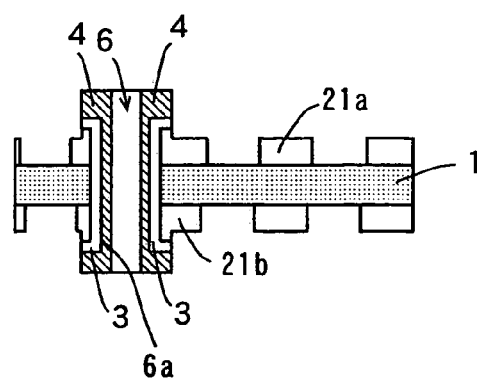

Consequently, conductor patterns 21a, 21b are formed, as shown in FIG. 1(g). Each of the conductor patterns 21a, 21b has a width of 75 μm, for example, and a pitch of 75 μm, for example.

Figure 1H:
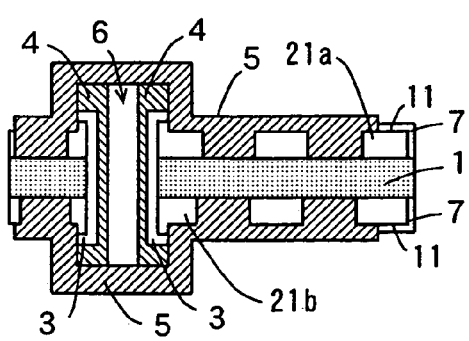

Further, as shown in FIG. 1(h), the conductor patterns 21a, 21b, electroless copper plating layer 3, and electrolytic copper plating layer 4 are coated with a cover lay 5 that is made of a polyimide resin with an adhesive. The cover lay 5 has a thickness of 20 μm, for example. In this case, a terminal (contact) 11 of the conductor pattern 21a is left exposed.

After this, by electroless nickel/gold plating, an electroless gold plating layer 7 is formed on the terminal 11 of the exposed conductor pattern 21a. The thickness of the electroless nickel/gold plating is preferably such that the nickel is not smaller than 1 μm and not greater than 5 μm, and the gold is not smaller than 0.05 μm and not greater than 0.2 μm.

In the foregoing manner, the electrolytic copper plating layer 4 is formed on the overall surface of the electroless copper plating layer 3 during the formation of the electrolytic copper plating layer 4 shown in FIG. 1(d), which makes the current density including that of the peripheral region of the through hole 6 uniform. This allows for a uniform thickness of the electrolytic copper plating layer 4 on the peripheral region 6b of the through hole 6 (FIG. 1(e)). Moreover, during the step of FIG. 1(e) that follows the formation of the electrolytic copper plating layer 4, the electrolytic copper plating layer 4 is removed except the portions on the inner surface 6a and the peripheral region 6b of the through hole 6, and then the thickness of each of the metal foils 2a, 2b is reduced during the step of FIG. 1(f). This allows for further improved flexural properties of the double-sided printed circuit board. In addition, the flexibility of the insulating substrate 1 even further improves the flexural properties of the double-sided printed circuit board. This results in a double-sided printed circuit board with improved flexural properties and electrical connection reliability.

Next, a method for manufacturing the insulating substrate 1 having the metal foils 2a, 2b on its both sides is described. The metal foils 2a, 2b are formed on both sides of the insulating substrate 1 without using an adhesive.

More specifically, the solution of a polyamic acid resin is applied on the surface of the metal foil 2a, and then cured by drying and heating to form a polyimide resin layer on the surface of the metal foil 2a. Also, the solution of a thermoplastic polyimide resin is applied on the surface of the metal foil 2b and then dried to form a thermoplastic polyimide resin layer on the surface of the metal foil 2b. After this, the polyimide resin layer is superimposed on the thermoplastic polyimide resin, and the two layers are bonded by applying pressure and heat using a heat press. In this manner, the metal foils 2a, 2b are formed on both sides of the insulating substrate 1 without using an adhesive.

(2) Second Embodiment

Next, FIGS. 2(a), 2(b), 2(c), 2(d), 2(e), 2(f), 2(g), 2(h) are cross sectional views showing the steps of manufacturing a double-sided printed circuit board according to the second embodiment. The manufacturing steps of the double-sided printed circuit board in the second embodiment differ from the manufacturing steps of the double-sided printed circuit board in the first embodiment as follows.

Figure 2A:
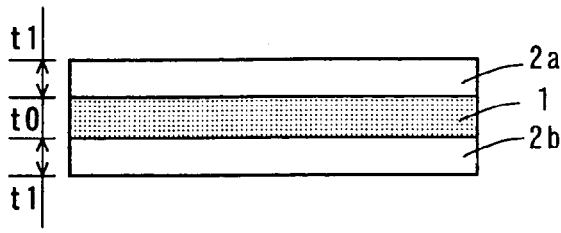
FIGS. 2(a), 2(b), 2(c), 2(d), 2(e), 2(f), 2(g), and 2(h) are cross sectional views showing the manufacturing steps of a double-sided printed circuit board according to a second embodiment of the present invention.

First, as shown in FIG. 2(a), an insulating substrate 1 having a metal foil 2a and a metal foil 2b on its both sides is prepared. Each of the metal foils 2a, 2b is made of copper, and the insulating substrate 1 is made of a layer of polyimide resin. The insulating substrate 1 preferably has a thickness t0 of not smaller than 12.5 μm and not greater than 125 μm, and each of the metal foils 2a, 2b preferably has a thickness t1 of not smaller than 5 μm and not greater than 35 μm.

Figure 2B:
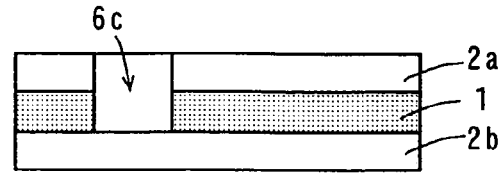

Then, as shown in FIG. 2(b), a blind via hole 6c is formed in a prescribed position such that it passes through the metal foil 2a and insulating substrate 1. The blind via hole 6c is formed by drilling, punching, laser machining or other processes. The inside diameter of the blind via hole 6c is preferably not smaller than 25 μm and not greater than 500 μm.

Figure 2C:
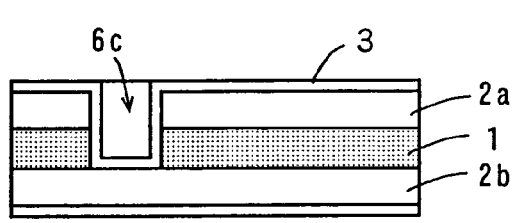

Then, a conductive layer is formed on the insulating substrate 1, metal foil 2a, and metal foil 2b. In the second embodiment, an electroless copper plating layer is used as the conductive layer as in the first embodiment. That is, as shown in FIG. 2(c), the electroless copper plating layer 3 is formed on an inner surface 6d of the blind via hole 6c and the surfaces of the metal foils 2a, 2b. The metal foil 2a and metal foil 2b are electrically connected through the electroless copper plating layer 3. The electroless copper plating layer 3 has a thickness of 0.3 μm, for example.

Figure 2D:
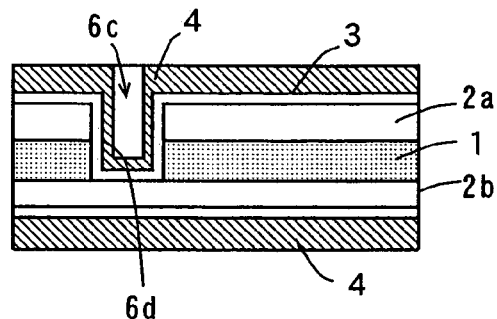

After this, electrolytic copper plating is applied to the overall surface of the electroless copper plating layer 3 to form an electrolytic copper plating layer 4, as shown in FIG. 2(d). The electrolytic copper plating layer 4 preferably has a thickness of not smaller than 5 μm and not greater than 20 μm, for example.

Figure 2E:
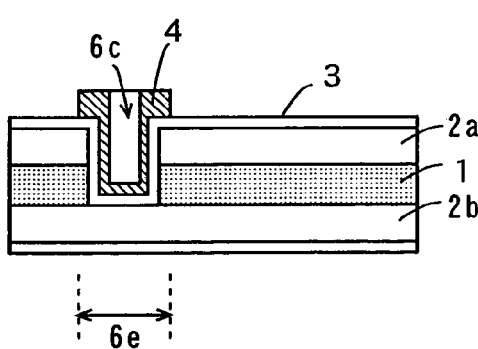

Etching is then performed with an etch resist (not shown) formed on the portions of the blind via hole 6c and a peripheral region 6e of the blind via hole to remove the electrolytic copper plating layer 4 except the portions of the blind via hole 6c and the peripheral region 6e, as shown in FIG. 2(e).

It is preferred that the peripheral region 6e is defined within the range of a radius of not smaller than 100 μm and not greater than 500 μm, for example, of the center of the blind via hole 6c.

Figure 2F:
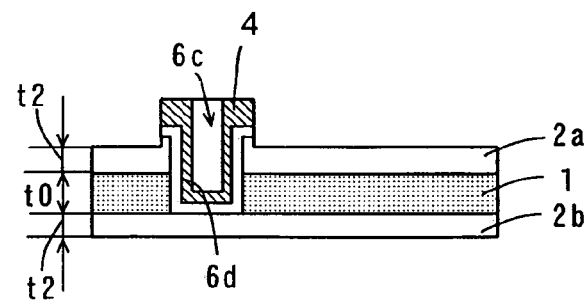

After removing the electrolytic copper plating layer 4 except the portions of the blind via hole 6c and the peripheral region 6e, the electroless copper plating layer 3 and the metal foils 2a, 2b are etched except the portion on the peripheral region 6e of the blind via hole 6c to reduce the thickness of each of the metal foils 2a, 2b, as shown in FIG. 2(f).

The thickness removed by the above-described etching process is preferably not smaller than 1 μm and not greater than 10 μm. Each of the etched metal foils 2a, 2b preferably has a uniform thickness t2 of not smaller than 5 μm and not greater than 20 μm.

After this, each of the metal foils 2a, 2b having its thickness reduced by etching is cleaned with an acid, and subsequently a photoresist (not shown) is formed on the surface of each of the metal foils 2a, 2b. The resulting metal foils 2a, 2b are patterned into a desired shape by exposure and development processes.

Figure 2G:
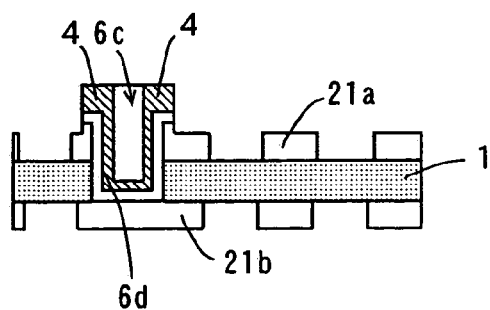

In this manner, conductor patterns 21a, 21b are formed as shown in FIG. 2(g). Each of the conductor patterns 21a, 21b has a width of 50 µm, for example, and a pitch of 50 µm, for example.

Figure 2H:
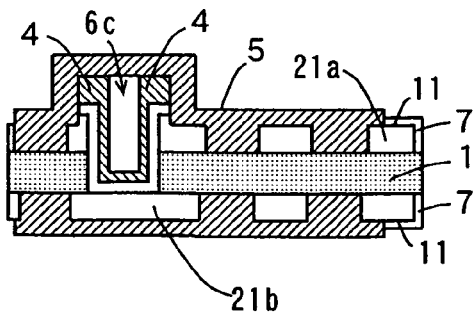

Further, the conductor patterns 21a, 21b, electroless copper plating layer 3, and electrolytic copper plating layer 4 are coated with a cover lay that is made of a polyimide resin with an adhesive, as shown in FIG. 2(h). The cover lay 5 has a thickness of 20 µm, for example. In this case, a terminal 11 of the conductor pattern 21a is left exposed.

After this, by electroless nickel/gold plating, an electroless gold plating layer 7 is formed on the exposed terminal 11 of the conductor pattern 21a. The thickness of the electroless nickel/gold plating is preferably such that the nickel is not smaller than 1 µm and not greater than 5 µm, and the gold is not smaller than 0.05 µm and not greater than 0.2 µm.

In the foregoing manner, the electrolytic copper plating layer 4 is formed on the overall surface of the electroless copper plating layer 3 during the formation of the electrolytic copper plating layer 4 shown in FIG. 2(d), which makes the current density including that of the peripheral region of the through hole 6 uniform. This allows for a uniform thickness of the electrolytic copper plating layer 4 on the peripheral region 6e of the through hole 6 (FIG. 2(e)). Moreover, during the step of FIG. 2(e) that follows the formation of the electrolytic copper plating layer 4, the electrolytic copper plating layer 4 is removed except the portions on the inner surface 6d and the peripheral region 6e of the blind via hole 6c, and then the thickness of each of the metal foils 2a, 2b is reduced except the portion on the peripheral region 6e of the blind via hole 6c during the step of FIG. 2(f). This allows for further improved flexural properties of the double-sided printed circuit board. In addition, the flexibility of the insulating substrate 1 even further improves the flexural properties of the double-sided printed circuit board. This results in a double-sided printed circuit board with improved flexural properties and electrical connection reliability.

(3) Correspondence Between Each claim Element and Each Component in the Preferred Embodiment In the first embodiment and second embodiment, each of the metal foils 2a, 2b corresponds to a conductor layer or a metal film; the electroless copper plating layer 3 corresponds to a conductive layer or an electroless metal plating layer; the electrolytic copper plating layer 4 corresponds to an electrolytic metal plating layer; the metal foils 2a, 2b correspond to first and second metal layers, respectively; the polyamide resin layer corresponds to a first resin layer; the thermoplastic polyamide resin layer corresponds to a second resin layer; and the cover lay 5 corresponds to a resin layer. The metal foil 2a, polyamide resin layer, thermoplastic polyamide resin layer, and metal foil 2b correspond to a laminate.

In the first embodiment, the through hole 6 corresponds to a via hole or a through hole.

In the second embodiment, the blind via hole 6 corresponds to a via hole or a hole.

(4) Other Embodiments

Although the use of a polyimide resin layer as the material of the insulating substrate 1 is discussed in each of the above-described first embodiment and second embodiment, any other insulating films of plastics with high flexibility may also be used as the insulating substrate. For example, a polyimide film, a polyethylene terephthalate film, a polyethylene naphthalate film, a polyether nitril film, a polyethersulfone film, a polyvinyl chloride film or the like may also be used.

It is preferable to use, in particular, a polyimide film, a polyethylene terephthalate film or a polyethylene naphthalate film as the material of the insulating substrate 1, since they are superior in such properties as thermal resistance, dimensional stability, electrical properties, mechanical properties, and chemical resistant properties.

Although the metal foils 2a, 2b as conductor layers are made of copper in each of the above-described first embodiment and second embodiment, other films of a metal including a copper alloy, gold, or aluminum may also be used as conductor layers.

Although the electrolytic copper plating layer 4 is used as an electrolytic metal plating layer in each of the above-described first embodiment and second embodiment, other electrolytic metal plating layers such as an electrolytic gold plating layer may also be used.

Further, although the step of forming the metal foils 2a, 2b on both sides of the insulating substrate 1 without using an adhesive is discussed above, other steps may also be used, for example, a step of forming the metal foils 2a, 2b on both sides of the insulating substrate 1 using an adhesive.

In that case, examples of the adhesive include thermosetting adhesives, thermoplastic adhesives, and sticky agents. A combination of the above may also be used.

Moreover, although the electroless copper plating layer 3 is formed over the metal foils 2a, 2b in each of the above-described first embodiment and second embodiment, other electroless metal plating layers which are not of copper plating, such as an electroless gold plating layer, may also be used as a conductive layer instead of the electroless copper plating layer 3. For example, a carbon black layer may be applied. With a carbon black layer instead of the electroless copper plating layer 3, it is preferred to remove, during the step of FIG. 1(c), the carbon black layer on the peripheral region 6b of the through hole 6, and leave the carbon black layer only on the inner surface 6a of the through hole 6. An electrolytic metal plating with a thickness of not greater than 5 µm may also be formed, if necessary, as a pretreatment for the electroless metal plating layer.

Moreover, although the conductor pattern 21a is coated with the cover lay 5 of a polyimide resin with an adhesive in each of the first embodiment and second embodiment, a resin film may alternatively be laminated on the conductor pattern 21a as a resin layer. Such a resin film may be made of a photosensitive resin or non-photosensitive resin. With a photosensitive resin, for example, an aperture may be formed by exposure and development. With a non-photosensitive resin, an aperture may be formed by chemical etching. Alternatively, a resin film having an aperture formed therein may be laminated.

EXAMPLES

In Examples, double-sided printed circuit boards were manufactured according to the above-described first embodiment and second embodiment for evaluation.

Inventive Example 1

In Inventive Example 1, an insulating substrate 1 made of a 25-μm polyimide resin layer and having 18-μm metal foils 2a, 2b made of copper on its both sides was prepared.

Next, a through hole 6 with a diameter of 100 μm was formed by laser machining. Then, an electroless copper plating layer 3 with a thickness of 0.3 μm was formed on the insulating substrate 1 and metal foils 2a, 2b as a conductive layer. An electrolytic copper plating layer 4 with a thickness of 15 μm was subsequently formed on the overall surface of the electroless copper plating layer 3.

After the formation of the electrolytic copper plating layer 4, with an etch resist formed on a peripheral region 6b of the through hole 6, the electrolytic copper plating layer 4 was etched away except the portions on an inner surface 6a and the peripheral region 6b of the through hole 6. In inventive Example 1, the peripheral region 6b was defined in the range of a 250-μm diameter of the center of the through hole 6.

Further, the thickness of each of the metal foils 2a, 2b except the portion of peripheral region 6b of the through hole 6 was reduced by 6 μm by etching, so that each of the metal foils 2a, 2b had a thickness of 12 μm.

Then, the metal foils 2a, 2b were etched using a photoresist to form conductor patterns 21a, 21b, each having a width of 75 μm and a pitch of 75 μm.

Finally, a cover lay 5 with a thickness of 20 μm was formed with a terminal 11 being exposed. The double-sided printed circuit board was thus obtained.

Inventive Example 2

In Inventive Example 2, an insulating substrate 1 made of a 25-μm polyimide resin layer and having 18-μm metal foils 2a, 2b made of copper on its both sides was prepared.

Next, a blind via hole 6c with a diameter of 75 μm was formed by laser machining. Then, an electroless copper plating layer 3 with a thickness of 0.3 μm was formed over the insulating substrate 1 and metal foils 2a, 2b as a conductive layer. An electrolytic copper plating layer 4 with a thickness of 15 μm was subsequently formed on the overall surface of the electroless copper plating layer 4.

After the formation of the electrolytic copper plating layer 4, with an etch resist formed on a peripheral region 6e of the blind via hole 6c, the electrolytic copper plating layer 4 was etched away except the portions on an inner surface and the peripheral region 6e of the blind via hole 6c. In Inventive Example 2, the peripheral region 6e was defined in the range of a 175-μm diameter of the center of the blind via hole 6c.

Further, the thickness of each of the metal foils 2a, 2b except the portion on peripheral region 6e of the blind via hole 6c was reduced by 6 μm by etching, so that each of the metal foils 2a, 2b had a thickness of 12 μm.

After this, metal foils 2a, 2b were etched using a photoresist to form conductor patterns 21a, 21b, each having a width of 50 μm and a pitch of 50 μm.

Finally, a cover lay 5 with a thickness of 20 μm was formed with a terminal 11 being exposed. The double-sided printed circuit board was thus obtained.

Comparative Example 1

In Comparative Example 1, as in Inventive Example 1, an insulating substrate 1 made of a 25-μm polyimide resin layer and having 18-μm metal foils 2a, 2b of copper on its both sides was prepared.

Next, a through hole with a diameter of 100 μm was formed by laser machining. Then, an electroless copper plating layer 3 with a thickness of 0.3 μm was formed on the insulating substrate 1 and metal foils 2a, 2b as a conductive layer. An etch resist was subsequently formed with an inner surface 6a and peripheral region 6b of the through hole 6 being exposed, followed by the formation of an electrolytic copper plating layer 4 with a thickness of 15 μm on the electroless copper plating layer 3 on the inner surface 6a and peripheral region 6b of the through hole 6. In Comparative Example 1, the peripheral region was defined in the range of a 250-μm diameter of the center of the through hole 6, as in Inventive Example 1.

After removing the plating resist, the metal foils 2a, 2b were cleaned with an acid as a pretreatment for photoresist coating. The cleaning process removes the electroless copper plating layer 3.

After this, the metal foils 2a, 2b were etched using a photoresist to form conductor patterns 21a, 21b, each having a width of 75 μm and a pitch of 75 μm.

Finally, a cover lay 5 with a thickness of 20 μm was formed with a terminal 11 being exposed. The double-sided printed circuit board was thus obtained.

Comparative Example 2

In Comparative Example 2, as in Inventive Example 2, an insulating substrate 1 made of a 25-μm polyimide resin layer and having 18-μm metal foils 2a, 2b made of copper on its both sides was prepared.

Next, a blind via hole 6c with a diameter of 75 μm was formed by laser machining. Then, an electroless copper plating layer 3 with a thickness of 0.3 μm was formed on the insulating substrate 1 and metal foils 2a, 2b as a conductive layer. An etch resist was subsequently formed with an inner surface 6d and peripheral region 6e of the blind via hole 6c being exposed, followed by the formation of an electrolytic copper plating layer 4 with a thickness of 15 μm on the electroless copper plating layer 3 on the inner surface 6d and peripheral region 6e of the blind via hole 6c. In Comparative Example 2, the peripheral region 6e was defined in the range of a 175-μm diameter of the center of the blind via hole 6c, as in Inventive Example 2.

After removing the plating resist, the metal foils 2a, 2b were cleaned with an acid as a pretreatment for photoresist coating. The cleaning process removes the electroless copper plating layer 3.

Then, the metal foils 2a, 2b were etched using a photoresist to form conductor patterns, each having a width of 50 μm and a pitch of 50 μm.

Finally, a cover lay 5 with a thickness of 20 μm was formed with a terminal 11 being exposed. The double-sided printed circuit board was thus obtained.

(Evaluation)

For each of the double-sided printed circuit boards manufactured in the above-described Inventive Example 1, Inventive Example 2, Comparative Example 1, and Comparative Example 2, the mean value and standard deviation was determined by thirty-two point measurements of the thickness of the peripheral region 6b or 6e of the through hole or the blind via hole.

Further, thermal cycle tests were conducted on the double-sided printed circuit boards in Inventive Example 1, Inventive Example 2, Comparative Example 1, and Comparative Example 2 onto which semiconductor devices were soldered. Each of these double-sided printed circuit boards underwent 1000 cycles of thermal cycling from −40° C. to 125° C., followed by continuity tests.

Moreover, flexural tests were conducted (in accordance with JIS C5016) on the double-sided printed circuit boards in Inventive Example 1, Inventive Example 2, Comparative Example 1, and Comparative Example 2. A flexural test indicates the number of flexure cycles before a disconnection occurs in the conductor patterns formed in the double-sided printed circuit board. Measurements and test results are given in Table shown below:

TABLE 1

|  | mean thickness value (μm) | thickness standard deviation (μm) | difference between maximum thickness value and minimum thickness value (μm) | connection reliability | flexural properties (cycles) |
|---|---|---|---|---|---|
| Inventive example 1 | 29.6 | 0.5 | 2.0 | without failure | 4000 |
| Inventive example 2 | 29.8 | 0.5 | 1.9 | without failure | 3900 |
| Comparative example 1 | 30.9 | 1.9 | 7.5 | disconnection | 1200 |
| Comparative example 2 | 30.8 | 1.8 | 8.0 | disconnection | 1000 |

As shown in Table 1, the mean thickness value of the peripheral region was 29.6 μm for Inventive Example 1; 30.9 μm for Comparative Example 1; 29.8 μm for Inventive Example 2; and 30.8 μm for Comparative Example 2.

It is also seen that the thickness standard deviation of the peripheral region was 0.5 μm for Inventive Example 1; 1.9 μm for Comparative Example 1; 0.5 μm for Inventive Example 2; and 1.8 μm for Comparative Example 2. Further, the difference between the maximum thickness value and the minimum thickness value was 2.0 μm for Inventive Example 1; 1.9 μm for Inventive Example 2; 7.5 μm for Comparative Example 1; and 8.5 μm for Comparative Example 2.

Moreover, the continuity tests conducted on Inventive Example 1 and Inventive Example 2 after the thermal cycle tests showed no failures, whereas the thermal cycle tests on Comparative Example 1 and Comparative Example 2 showed the occurrence of disconnections.

Moreover, the result of flexural test for Inventive Example 1 was 4000 cycles; 3900 cycles for Inventive Example 2; 1200 cycles for Comparative Example 1; and 1000 cycles for Comparative Example 2.

The foregoing reveals that the double-sided printed circuit board manufactured according to the method in Inventive Example 1 exhibits less uneven thickness of the electrolytic copper plating layer 4 and improved electrical connection reliability and flexural properties, as compared to the double-sided printed circuit board manufactured according to the method in Comparative Example 1. Similarly, the double-sided printed circuit board manufactured according to the method in Inventive Example 2 exhibits less uneven thickness of the electrolytic copper plating layer 4 and improved electrical connection reliability and flexural properties, as compared to the double-sided printed circuit board manufactured according to the method in Comparative Example 2.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a double-sided printed circuit board comprising the steps of:
   preparing an insulating substrate having conductor layers on both sides thereof;
   forming a via hole that passes through at least one of said conductor layers and said insulating substrate;
   forming a conductive layer on an inner surface of said via hole and surfaces of said conductor layers;
   forming an electrolytic metal plating layer on an overall surface of said conductive layer;
   removing said electrolytic metal plating layer except portions on said inner surface of said via hole and a peripheral region of said via hole;
   and after removing said electrolytic metal plating layer, processing said conductor layers to form conductor patterns.

2. The method for manufacturing a double-sided printed circuit board according to claim 1, wherein said step of forming said via hole includes the step of forming a through hole that passes through both of said conductor layers and said insulating substrate as said via hole.

3. The method for manufacturing a double-sided printed circuit board according to claim 1, wherein said step of forming said via hole includes the step of forming a hole that passes through one of said conductor layers and said insulating substrate.

4. The method for manufacturing a double-sided printed circuit board according to claim 1, further comprising the step of, after removing said electrolytic metal plating layer, reducing the thickness of each of said conductor layers except that of said via hole and said peripheral region of said via hole.

5. The method for manufacturing a double-sided printed circuit board according to claim 1, wherein said step of preparing said insulating substrate includes the step of preparing a flexible substrate having conductor layers on both sides thereof as said insulating substrate.

6. The method for manufacturing a double-sided printed circuit board according to claim 1, wherein said step of preparing said insulating substrate includes the step of preparing an insulating substrate having metal films as said conductor layers on both sides thereof.

7. The method for manufacturing a double-sided printed circuit board according to claim 1, wherein said step of forming said conductive layer includes the step of forming an electroless metal plating layer as said conductive layer.

8. The method for manufacturing a double-sided printed circuit board according to claim 1, wherein said step of forming said conductive layer includes the step of forming a carbon layer as said conductive layer.

9. The method for manufacturing a double-sided printed circuit board according to claim 1, wherein said step of preparing said insulating substrate having said conductor layers on the both sides thereof includes the steps of:
- forming a first resin layer on a first metal layer;
- forming a second resin layer on a second metal layer;
- superimposing said second resin layer on said first resin layer to form a laminate including said first metal layer, said first resin layer, said second resin layer, and said second metal layer; and
- applying pressure and heat to said laminate.

10. The method for manufacturing a double-sided printed circuit board according to claim 1, further comprising the step of forming a resin layer on said insulating substrate so as to cover said conductor patterns.

11. A method for manufacturing a double-sided printed circuit board comprising the steps of:
- preparing an insulating substrate having conductor layers on both sides thereof;
- forming a via hole that passes through at least one of said conductor layers; and said insulating substrate;
- forming a conductive layer on an inner surface of said via hole and surfaces of said conductor layers, which have not yet been patterned;
- forming an electrolytic metal plating layer on an overall surface of said conductive layer;
- removing said electrolytic metal plating layer except portions on said inner surface of said via hole and a peripheral region of said via hole; and
- after removing said electrolytic metal plating layer, processing said conductor layers to form conductor patterns.

12. A method for manufacturing a double-sided printed circuit board comprising the steps of:
- preparing an insulating substrate having conductor layers on both sides thereof;
- forming a via hole that passes through at least one of said conductor layers; and said insulating substrate;
- forming a conductive layer on an inner surface of said via hole and surfaces of said conductor layers;
- forming an electrolytic metal plating layer directly on an overall surface of said conductive layer;
- removing said electrolytic metal plating layer except portions on said inner surface of said via hole and a peripheral region of said via hole; and
- after removing said electrolytic metal plating layer, processing said conductor layers to form conductor patterns.

13. A method for manufacturing a double-sided printed circuit board comprising the following the sequence listed:
- preparing an insulating substrate having conductor layers on both sides thereof;
- forming a via hole that passes through at least one of said conductor layers; and said insulating substrate;
- forming a conductive layer on an inner surface of said via hole and surfaces of said conductor layers;
- forming an electrolytic metal plating layer on an overall surface of said conductive layer;
- removing said electrolytic metal plating layer except portions on said inner surface of said via hole and a peripheral region of said via hole; and
- after removing said electrolytic metal plating layer, processing said conductor layers to form conductor patterns.

* * * * *